(12) United States Patent
Toyomaki

(10) Patent No.: US 11,721,564 B2
(45) Date of Patent: Aug. 8, 2023

(54) SUBSTRATE PROCESSING SYSTEM AND SUBSTRATE TRANSFER APPARATUS AND METHOD

(71) Applicant: TOKYO ELECTRON LIMITED, Tokyo (JP)

(72) Inventor: Toshiaki Toyomaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 406 days.

(21) Appl. No.: 16/842,087

(22) Filed: Apr. 7, 2020

(65) Prior Publication Data
US 2020/0321227 A1  Oct. 8, 2020

(30) Foreign Application Priority Data

Apr. 8, 2019 (JP) .................................. 2019-073653
Dec. 23, 2019 (JP) .................................. 2019-231636

(51) Int. Cl.
  *H01L 21/67* (2006.01)
  *H01L 21/3065* (2006.01)
  *H01J 37/305* (2006.01)

(52) U.S. Cl.
  CPC .... *H01L 21/67069* (2013.01); *H01L 21/3065* (2013.01); *H01L 21/67155* (2013.01); *H01L 21/67173* (2013.01); *H01L 21/67184* (2013.01); *H01L 21/67196* (2013.01); *H01J 37/305* (2013.01)

(58) Field of Classification Search
  CPC ......... H01L 21/67201; H01L 21/67196; H01L 21/67703; H01L 21/67745; H01L 21/67161
  See application file for complete search history.

(56) References Cited

U.S. PATENT DOCUMENTS

| 2003/0035709 A1* | 2/2003 | Cox ................... H01L 21/67742 118/719 |
| 2008/0124197 A1* | 5/2008 | van der Meulen ......... H01L 21/67703 414/217 |
| 2013/0202387 A1* | 8/2013 | Hiroki ............... H01L 21/67184 414/217 |
| 2014/0003891 A1* | 1/2014 | Kobayashi ........ H01L 21/67703 414/217 |
| 2014/0126980 A1* | 5/2014 | Wamura ............ H01L 21/67184 414/221 |

(Continued)

FOREIGN PATENT DOCUMENTS

JP     2018-088549 A     6/2018

*Primary Examiner* — Keath T Chen
*Assistant Examiner* — Margaret Klunk
(74) *Attorney, Agent, or Firm* — Weihrouch IP

(57) ABSTRACT

A substrate processing system includes a first substrate processing chamber, a first substrate transfer chamber connected to the first substrate processing chamber, a second substrate processing chamber, and a second substrate transfer chamber connected to the second substrate processing chamber. The substrate processing system further includes a buffer chamber connected between the first substrate transfer chamber and the second substrate transfer chamber, the buffer chamber having at least one substrate holder. At least a part of the buffer chamber and at least one of the first substrate transfer chamber or the second substrate transfer chamber are vertically overlapped with each other.

8 Claims, 11 Drawing Sheets

(56) References Cited

U.S. PATENT DOCUMENTS

2020/0075377 A1\* 3/2020 Wakabayashi .... H01L 21/67754
2021/0202283 A1\* 7/2021 Kim ................. H01L 21/67775

\* cited by examiner

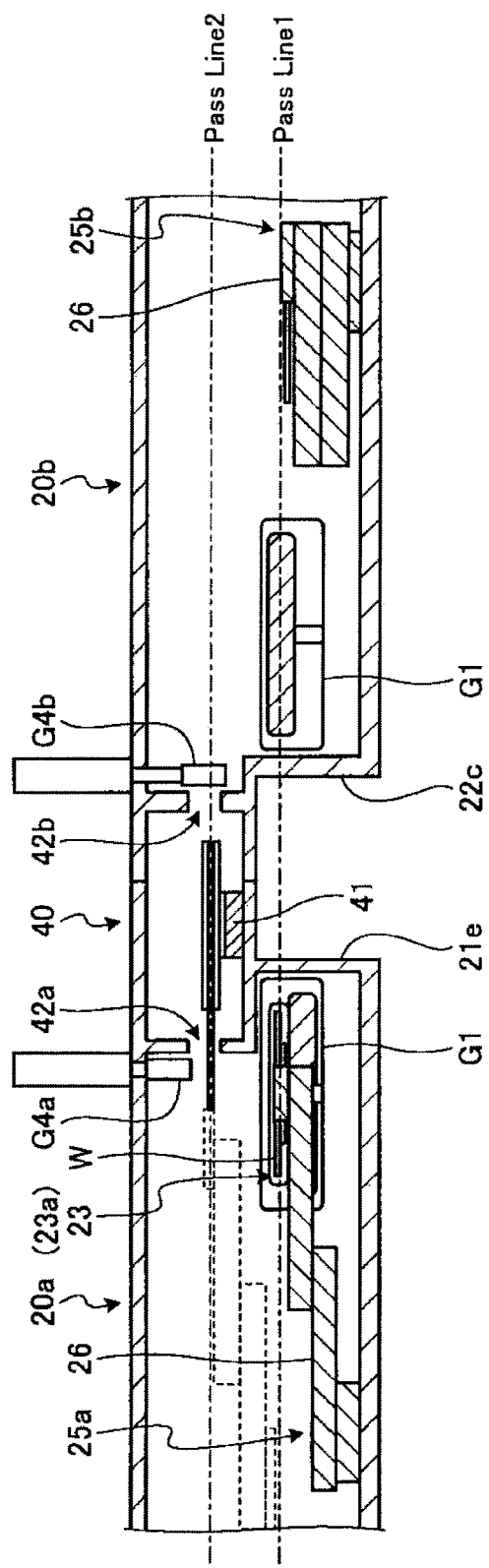

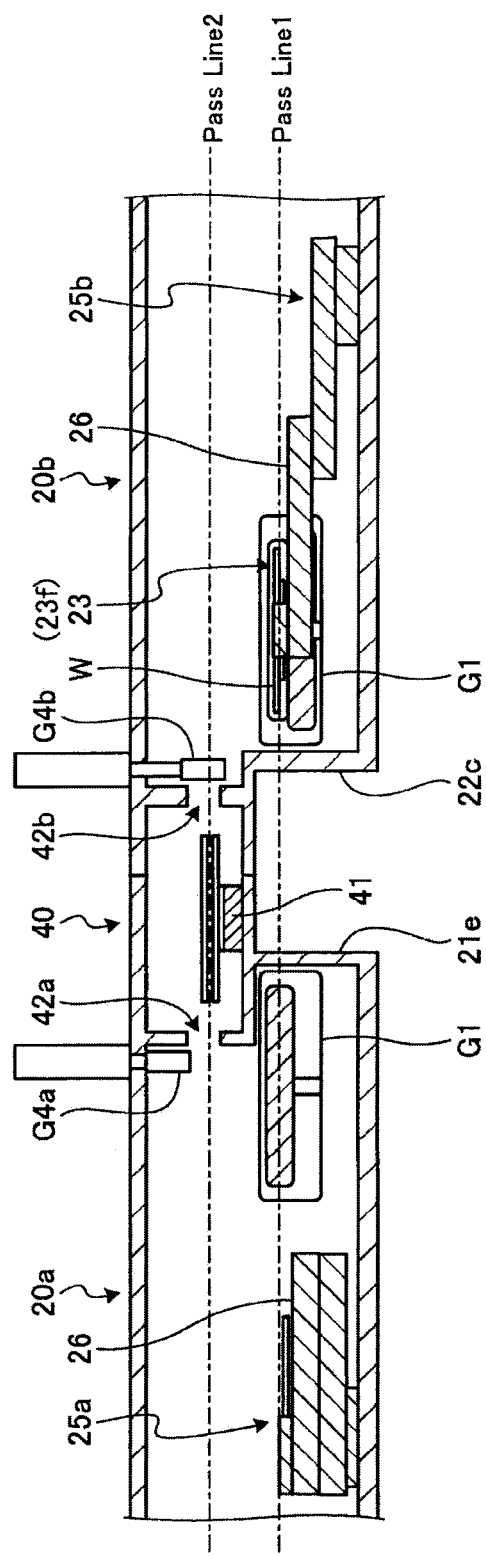

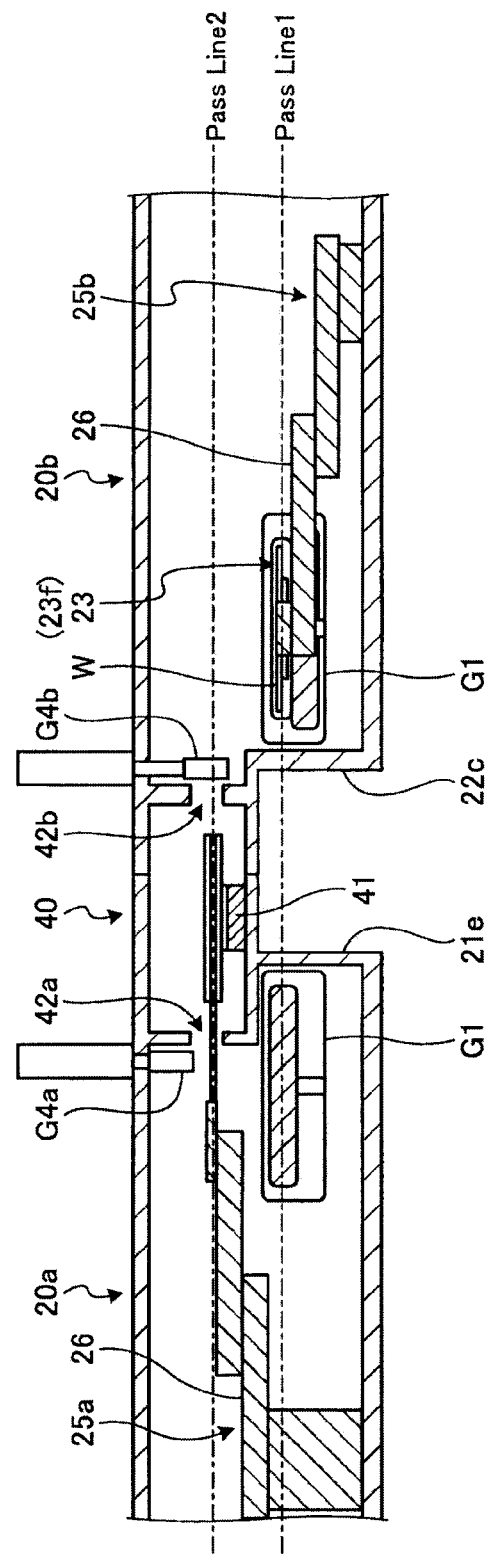

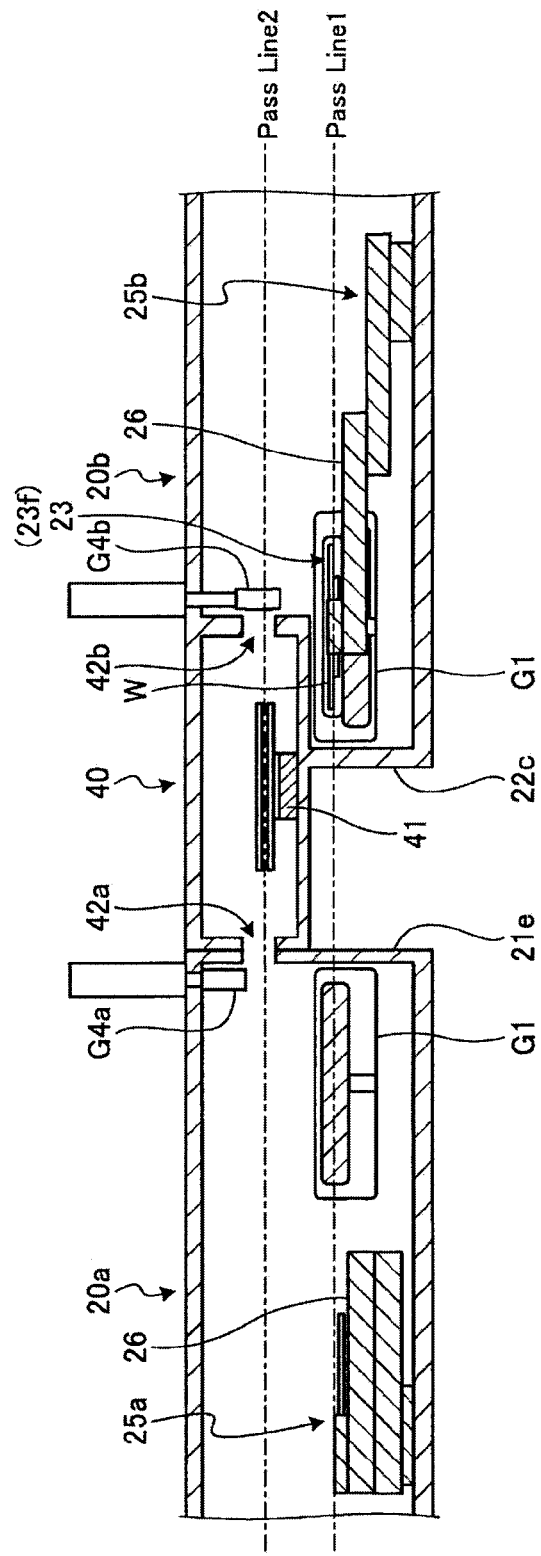

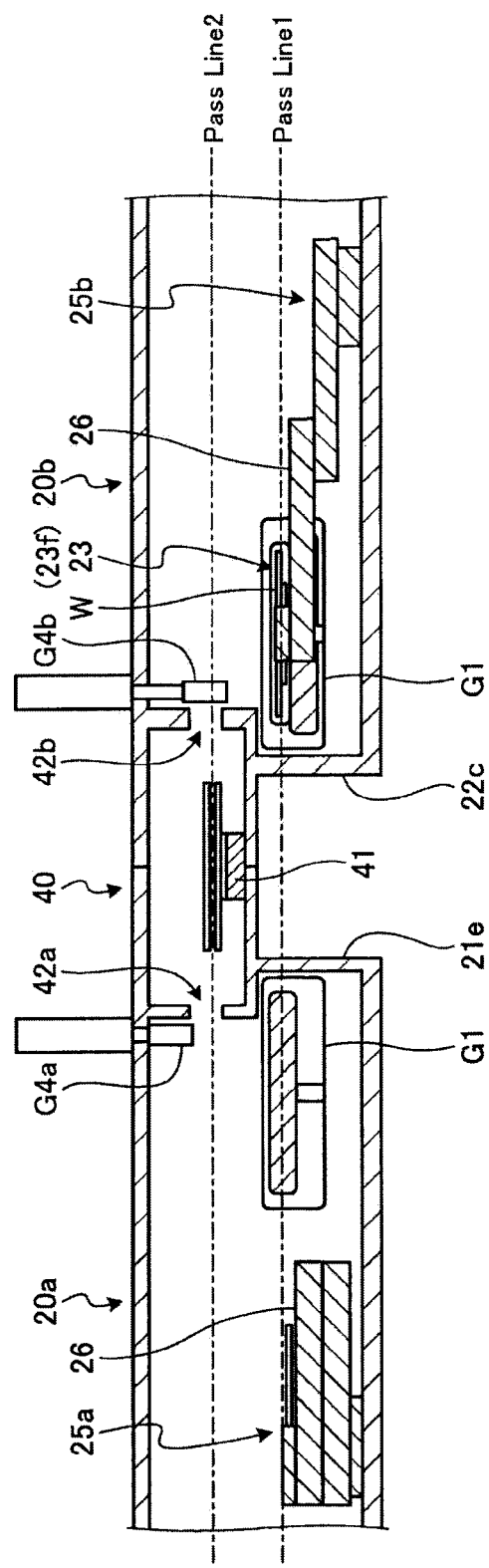

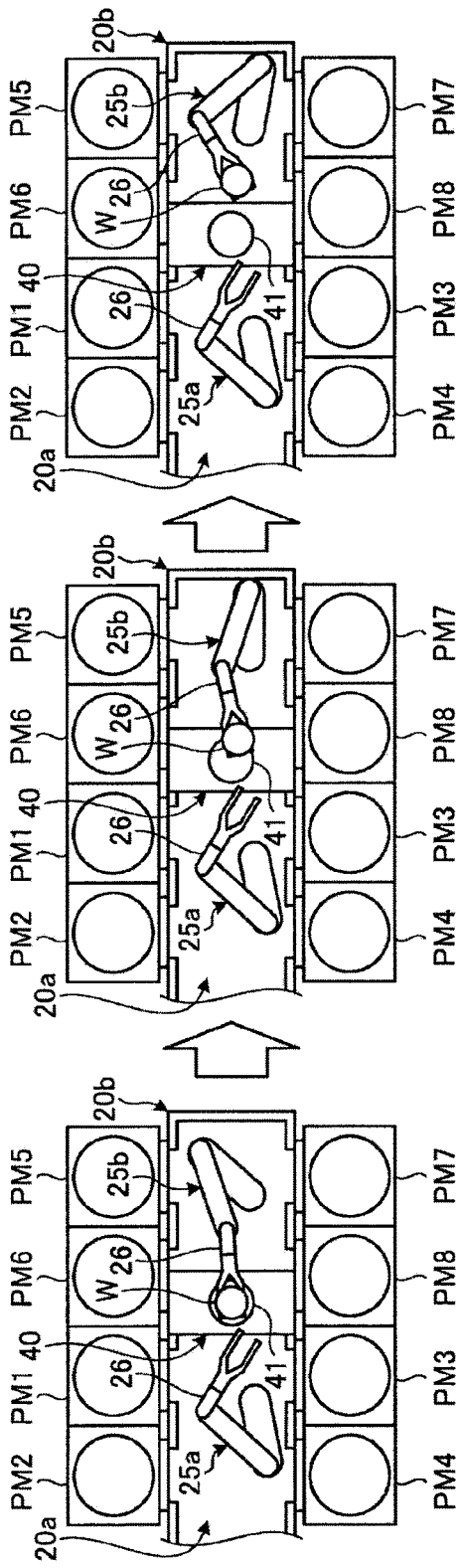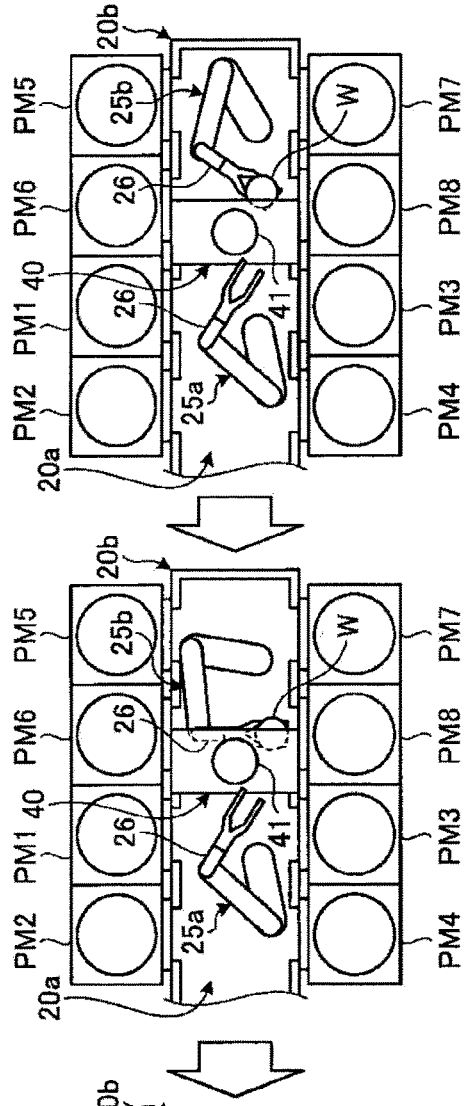

SUBSTRATE PROCESSING SYSTEM AND SUBSTRATE TRANSFER APPARATUS AND METHOD

CROSS-REFERENCE TO RELATED APPLICATIONS

This application claims priority to Japanese Patent Application Nos. 2019-073653 and 2019-231636, respectively filed on Apr. 8, 2019 and Dec. 23, 2019, the entire contents of which are incorporated herein by reference.

TECHNICAL FIELD

The present disclosure relates to a substrate processing system and a substrate transfer apparatus and method.

BACKGROUND

Japanese Patent Application Publication No. 2018-88549 discloses a substrate processing apparatus in which two vacuum transfer chambers, each being connected to a plurality of vacuum processing chambers, are connected to each other through an intermediate transfer chamber.

The present disclosure provides a technique for suppressing an increase in the size of an installation area.

SUMMARY

In accordance with an aspect of the present disclosure, there is provided a substrate processing system including: a first substrate processing chamber; a first substrate transfer chamber connected to the first substrate processing chamber; a second substrate processing chamber; a second substrate transfer chamber connected to the second substrate processing chamber; and a buffer chamber connected between the first substrate transfer chamber and the second substrate transfer chamber, the buffer chamber having at least one substrate holder. Further, at least a part of the buffer chamber and at least one of the first substrate transfer chamber or the second substrate transfer chamber are vertically overlapped with each other.

BRIEF DESCRIPTION OF THE DRAWINGS

The objects and features of the present disclosure will become apparent from the following description of embodiments, given in conjunction with the accompanying drawings, in which:

FIG. 2 is a cross-sectional view showing an example of a schematic configuration of a connecting unit according to the embodiment;

FIG. 3A is a cross-sectional view showing an example of a state in which a transfer robot according to the embodiment is lowered;

FIG. 3B is a cross-sectional view showing an example of a state in which the transfer robot according to the embodiment is raised;

FIG. 4A is a cross-sectional view showing another example of the schematic configuration of the connecting unit according to the embodiment;

FIG. 4B is a cross-sectional view showing still another example of the schematic configuration of the connecting unit according to the embodiment;

FIGS. 5A to 5F show an example of a wafer transfer flow according to the embodiment;

DETAILED DESCRIPTION

Hereinafter, embodiments of a substrate processing system and a substrate transfer apparatus and method of the present disclosure will be described in detail with reference to the accompanying drawings. The following embodiments are not intended to limit the substrate processing system, the substrate transfer apparatus, and the substrate transfer method of the present disclosure.

(Configuration of the Substrate Processing Apparatus)

Figure 1:
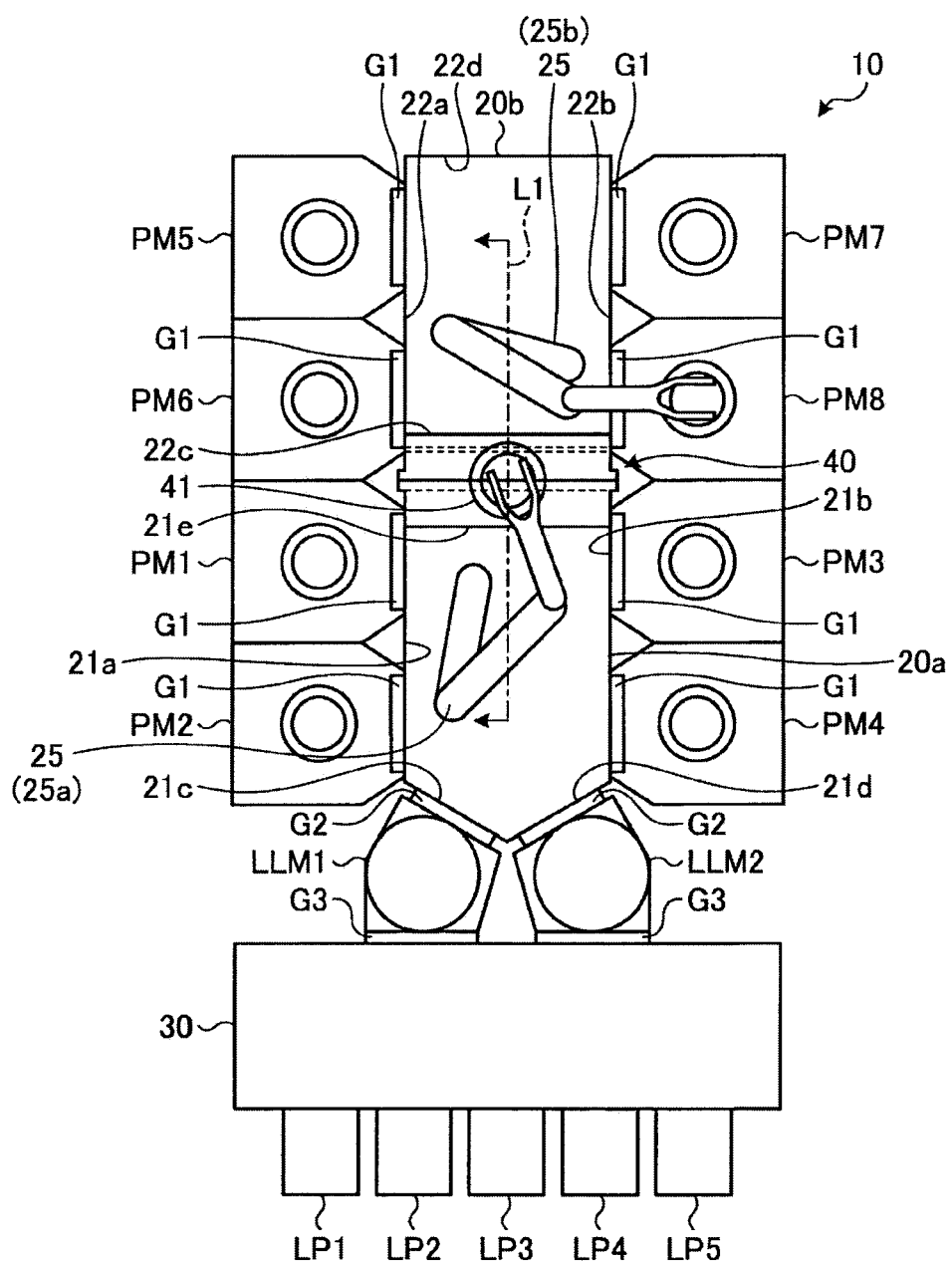
FIG. 1 shows an example of an overall schematic configuration of a substrate processing apparatus according to an embodiment.

An example of the substrate processing system of the present embodiment will be described. FIG. 1 shows an example of an overall schematic configuration of the substrate processing system of the present embodiment. The substrate processing system 10 of the present embodiment performs substrate processing on a substrate in a vacuum (depressurized) state. The substrate processing may be, e.g., film formation, etching, or the like. The substrate processing may be a processing that uses plasma (plasma processing) or a processing that does not use plasma (non-plasma processing).

The substrate processing system 10 generally includes a plurality of vacuum (depressurized) transfer chambers (substrate transfer chambers) 20, a plurality of processing modules (substrate processing chambers) PM, and a plurality of load-lock modules LLM. The substrate processing system 10 further includes a loader module (EFEM; Equipment Front End Module) 30 and a plurality of load ports LP.

In the example of FIG. 1, the substrate processing system 10 includes two vacuum transfer chambers 20a and 20b, eight processing modules PM1 to PM8, two load-lock modules LLM1 and LLM2, and five load ports LP1 to LP5. However, the number of the vacuum transfer chamber 20, the processing modules PM, the load-lock modules LLM, and the load ports LP of the substrate processing system 10 are not limited thereto. Hereinafter, the two vacuum transfer chambers 20a and 20b will be collectively referred to as "vacuum transfer chamber 20" unless otherwise stated. Similarly, the eight processing modules PM1 to PM8 will be collectively referred to as "processing module PM"; the two load-lock modules LLM1 and LLM2 will be collectively referred to as "load-lock module LLM"; and the five load ports LP1 to LP5 will be collectively referred to as "load ports LP."

In one embodiment, the vacuum transfer chamber 20a has a pentagonal planar shape with two substantially parallel sidewalls 21a and 21b, sidewalls 21c and 21d each having one end connected to one end of each of the sidewalls 21a and 21b, and a sidewall 21e connected to the other end of each of the sidewalls 21a and 21b. In one embodiment, both the angle between the sidewalls 21a and 21c and the angle between the sidewalls 21b and 21d are obtuse angles, and the sidewalls 21c and 21d extend outward from one end to the other end. In one embodiment, the vacuum transfer chamber 20b has a rectangular planar shape with four sidewalls 22a to 22d.

The vacuum transfer chambers 20 (20a and 20b) are connected through a connecting unit (buffer chamber) 40. The substrate transfer apparatus includes, for example, the vacuum transfer chamber 20a or 20b and the connecting unit 40.

Each of the processing modules PM performs substrate processing on a semiconductor substrate, i.e., a wafer W, in a vacuum (depressurized) atmosphere. The inside of each processing module PM is maintained in a vacuum (depressurized) atmosphere during the processing of the wafer W. The substrate processing system 10 may perform the same type of vacuum processing in each of the processing modules PM. Alternatively, the substrate processing system 10 may perform different types of vacuum processing on the wafer W in the respective processing modules PM.

Each of the processing modules PM has a transfer port for transferring the wafer W into the processing module PM. The processing modules PM communicate with the vacuum transfer chambers 20 through the transfer ports. In the present embodiment, the processing modules PM1 and PM2 are connected to the sidewall 21a of the vacuum transfer chamber (front side vacuum transfer chamber) 20a and communicate with the vacuum transfer chamber 20a through the respective transfer ports. The processing modules PM3 and PM4 are connected to the sidewall 21b of the vacuum transfer chamber 20a and communicate with the vacuum transfer chamber 20a through the respective transfer ports. The processing modules PM5 and PM6 are connected to the sidewall 22a of the vacuum transfer chamber (rear side vacuum transfer chamber) 20b and communicate with the vacuum transfer chamber 20b through the respective transfer ports. The processing modules PM7 and PM8 are connected to the sidewall 22b of the vacuum transfer chamber 20b and communicate with the vacuum transfer chamber 20b through the respective transfer ports. Each of the transfer ports is provided with a gate valve G1 capable of opening and closing the transfer port.

The gate valve G1 is closed while the wafer W is being processed in the processing module PM. The gate valve G1 is opened when a processed wafer W is unloaded from the processing module PM and when an unprocessed wafer W is loaded into the processing module PM.

The vacuum transfer chamber 20 includes a gas exhaust unit (not shown), e.g., a vacuum pump so as to maintain the inside of the vacuum transfer chamber 20 in a vacuum (depressurized) atmosphere. A transfer robot 25 for transferring the wafer W is disposed in the vacuum transfer chamber 20. For example, a transfer robot 25a is disposed in the vacuum transfer chamber 20a, and a transfer robot 25b is disposed in the vacuum transfer chamber 20b. Further, the vacuum transfer chamber 20a is connected to the two load-lock modules LLM on the sidewalls 21c and 21d through two gate valves G2. The connecting unit 40 has a holder (substrate holder) 41 configured to hold the wafer W.

The transfer robot 25a transfers the wafer W to any one of the processing modules PM1 to PM4. The transfer robot 25b transfers the wafer W to any one of the processing modules PM5 to PM8. Further, the transfer robots 25a and 25b can transfer the wafers W between the vacuum transfer chambers 20a and 20b through the connecting unit 40. For example, in the case when the wafer W is transferred from the vacuum transfer chamber 20a to the vacuum transfer chamber 20b to perform vacuum processing on the wafer W in one of the processing modules PM5 to PM8, the transfer robot 25a transfers the wafer W from the vacuum transfer chamber 20a onto the holder 41 in the connecting unit 40. Then, the transfer robot 25b extracts the wafer W on the holder 41 from the connecting unit 40 and transfers the wafer W to the vacuum transfer chamber 20b. Next, the transfer robot 25b transfers the wafer W extracted from the connecting unit 40 from the vacuum transfer chamber 20b to one of the processing modules PM5 to PM8. For example, in the case when the wafer W processed in any one of the processing modules PM5 to PM8 is transferred to the load-lock module LLM, the transfer robot 25b extracts the wafer W from any one of the processing modules PM5 to PM8 and transfers the wafer W to the vacuum transfer chamber 20b. Then, the transfer robot 25b transfers the extracted wafer W from the vacuum transfer chamber 20b to the holder 41 in the connecting unit 40. Then, the transfer robot 25a extracts the wafer W on the holder 41 from the connecting unit 40 and transfers the wafer W to the vacuum transfer chamber 20a and then to the load-lock module LLM.

The wafer W is transferred from the vacuum transfer chamber 20 to each processing module PM. The wafer W processed in the processing module PM is transferred to another processing module PM where the next processing is to be performed through the vacuum transfer chamber 20. The wafer W that has been subjected to all processes is transferred to the load-lock module LLM through the vacuum transfer chamber 20.

The load-lock module LLM is connected to the loader module 30 on a surface opposite to a surface in contact with the vacuum transfer chamber 20a. A gate valve G3 is disposed between each load-lock module LLM and the loader module 30. The load-lock module LLM includes a stage (substrate support) for placing the wafer W. The load-lock module LLM includes a gas exhaust unit (not shown), e.g., a vacuum pump and a leak valve, so that the inner atmosphere of the load-lock module LLM can be switched between an atmospheric (normal pressure) atmosphere and a vacuum (depressurized) atmosphere. In the case of transferring the wafer W between the loader module 30 and the vacuum transfer chamber 20a, a pressure in the load-lock module LLM is controlled between the atmospheric atmosphere and the vacuum atmosphere.

The loader module 30 is maintained in an atmospheric (normal pressure) atmosphere. In the example of FIG. 1, the loader module 30 has a substantially rectangular planar shape. The load-lock modules LLM are arranged side by side on one long side of the loader module 30. The load ports LP are arranged side by side on the other long side of the loader module 30. Each of the load ports LP is provided with a carrier accommodating wafers W. The loader module 30 has a transfer unit such as an arm or the like. The transfer unit is configured to transfer the wafer W between the load-lock modules LLM and the load ports LP.

Next, a configuration example of the connecting unit 40 that connects the vacuum transfer chamber 20a and the vacuum transfer chamber 20b will be described. FIG. 2 is a cross-sectional view showing an example of a schematic configuration of the connecting unit according to the embodiment. FIG. 2 shows a cross section near the connecting unit 40 that is taken along a dashed line L1 in FIG. 1. Each of the vacuum transfer chambers 20 has a transfer port(s) 23 and communicates with the processing module(s)

PM through the transfer port(s) 23. The transfer port 23 is opened and closed by the gate valve G1. In the example of FIG. 2, the gate valve G1 of the processing module PM1 is opened. The vacuum transfer chamber 20a has a transfer port 23a configured to communicate with the processing module PM1. In the example of FIG. 2, the gate valve G1 of the processing module PM6 is closed. Although the vacuum transfer chamber 20b has the transfer port 23 configured to communicate with the processing module PM6, the transfer port 23 is in a close state by the gate valve G1.

The transfer robot 25a is disposed in the vacuum transfer chamber 20a. The transfer robot 25b is disposed in the vacuum transfer chamber 20b. The transfer robots 25a and 25b are articulated robots, each having an arm 26 in which a plurality of arm segments are rotatably connected with joints. Each of the transfer robots 25a and 25b can extend and contract the arm 26 in a horizontal direction by bending the joints. In one embodiment, the transfer ports are disposed at substantially the same height. The transfer robots 25a and 25b transfer the wafers W held by the arms 26 from the vacuum transfer chamber 20a and 20b to the processing modules PM through the transfer ports 23 by extending and contracting the arms 26. FIG. 2 shows a state in which the wafer W is transferred from the vacuum transfer chamber 20a to the processing module PM1 through the transfer port 23a disposed at a first height by the arm 26 of the transfer robot 25a. In this state, the arm 26 of the transfer robot 25b is contracted.

The connecting unit 40 connects the vacuum transfer chambers 20a and 20b at a position higher than moving spaces of the transfer robots 25a and 25b at the time of transferring the wafers W to the respective vacuum processing chambers. In other words, the connecting unit 40 connects the vacuum transfer chambers 20a and 20b at a second height higher than the first height at which the transfer ports 23 are disposed. In the substrate processing system 10 of the present embodiment, the upper surface of the connecting unit 40, the upper surface of the vacuum transfer chamber 20a, and the upper surface of the vacuum transfer chamber 20b have the same height and form the same plane. The connecting unit 40 has the holder 41 for holding the wafer W. A part of the vacuum transfer chamber 20a extends to a position below the connecting unit 40. In other words, the connecting unit 40 is disposed in a manner that the connecting unit 40 is penetrated into the upper portion of one or both of the vacuum transfer chambers 20a and 20b. Specifically, in one embodiment, the vacuum transfer chamber 20a has a stepped side portion, and the lower part of the stepped side portion protrudes more outward than the upper part. A part of the connecting unit 40 is disposed on the protruding part of the stepped side portion. Further, the transfer port 23a is positioned such that a part of the transfer port 23a and the protruding part are vertically overlapped with each other when viewed from the side. The transfer robot is configured to transfer the wafer between the vacuum transfer chamber and the vacuum processing chamber at the first height and to transfer the wafer between the vacuum transfer chamber and the connecting unit at the second height different from the first height. Therefore, the connecting unit 40 is disposed such that at least a part of the connecting unit 40 overlaps the range of motion of any one of the transfer robots 25a and 25b in the connected vacuum transfer chambers 20 when transferring the wafer W to the vacuum processing chamber when viewed from the top. In one embodiment, the second height is higher than the first height. In this case, a part of the range of motion of the transfer robot 25a when transferring the wafer W to the vacuum processing chamber goes below the connecting unit 40.

The transfer robots 25a and 25b are vertically movable. For example, the transfer robots 25a and 25b are vertically movable between the first height and the second height. FIGS. 3A and 3B are cross-sectional views showing an example of a state where the transfer robot 25 according to the embodiment is vertically moved. FIG. 3A shows an example in which the transfer robot 25a according to the embodiment is lowered to the first height. FIG. 3B shows an example in which the transfer robot 25a is raised to the second height. In one embodiment, at the first height, the arm 26 is located at the same height as the transfer port 23. In one embodiment, at the second height, the arm 26 is located at the same height as the holder 41. In FIGS. 2, 3A and 3B, "Pass Line1" indicates the first height and "Pass Line2" indicates the second height. The transfer robots 25a and 25b transfer the wafers W to the vacuum processing chambers through the transfer ports 23 at the first height. In the example of FIG. 3A, the end effectors (picks) of the transfer robots 25a and 25b are disposed at the first height. The vacuum transfer chamber 20b has a transfer port 23f configured to communicate with the processing module PM6. The transfer robot 25b transfers the wafer W from the vacuum transfer chamber 20b to the processing module PM6 using the arm 26 through the transfer port 23f. In this state, the arm 26 of the transfer robot 25a is contracted. Further, the transfer robots 25a and 25b move the wafers W held by the end effectors thereof from the first height to the second height and transfer the wafers W between the vacuum transfer chamber 20 and the connecting unit 40 at the second height. In other words, the transfer robots 25a and 25b reach the holder 41 and deliver the wafers W from the holder 41 at the second height. In the example of FIG. 3B, the wafer W held by the end effector of the transfer robot 25b is transferred at the first height, and the wafer W held by the end effector of the transfer robot 25a is transferred at the second height. The transfer robot 25a transfers the wafer W to the holder 41 by extending the arm 26 at the second height.

The connecting unit 40 has two openings 42a and 42b at the second height. The connecting unit 40 communicates with the vacuum transfer chambers 20a and 20b through the openings 42a and 42b, respectively. In other words, the vacuum transfer chambers 20a and 20b have the openings (the transfer ports 23) configured to communicate with the processing modules at the first height and have the openings 42a and 42b configured to communicate with the connecting unit 40 at the second height. In one embodiment, a gate valve G4a is disposed at the opening (first opening) 42a configured to communicate with the vacuum transfer chamber 20a. In one embodiment, a gate valve G4b is disposed at the opening (second opening) 42b configured to communicate with the vacuum transfer chamber 20b. The connecting unit 40 includes a gas exhaust unit and a gas supply unit (both not shown) for switching an inner pressure thereof. For example, even when the pressure in each of the vacuum transfer chambers 20a and 20b is switchable, the substrate processing system 10 can transfer the wafer W while adjusting the pressure in the connecting unit 40. In other words, in one embodiment, the connecting unit 40 may have a load-lock function. The vacuum transfer chambers 20a and 20b are separated from each other at the first height by the sidewalls 21e and 22c and are connected to each other at the second height by the connecting unit 40. At the first height, the space between the sidewalls 21e and 22c is an atmospheric space where lines for the gas exhaust unit and the gas supply unit are disposed.

As shown in FIGS. 2, 3A, and 3B, the above embodiment has described the case in which a part of the connecting unit 40 and the vacuum transfer chamber 20a are vertically overlapped with each other as an example. However, the present disclosure is not limited thereto, and at least a part of the connecting unit 40 and at least one of the vacuum transfer chamber 20a or the vacuum transfer chamber 20b may be vertically overlapped with each other. For example, a part of the connecting unit 40 and the vacuum transfer chamber 20b may be vertically overlapped with each other. FIG. 4A is a cross-sectional view showing another example of the schematic configuration of the connecting unit 40 according to the embodiment. In FIG. 4A, a part of the vacuum transfer chamber 20b extends to a position below the connecting unit 40, and a part of the connecting unit 40 and the vacuum transfer chamber 20b are vertically overlapped with each other. In FIG. 4A, a part of the range of motion of the transfer robot 25b when transferring the wafer W to the vacuum processing chamber goes below the connecting unit 40.

Alternatively, for example, a part of the connecting unit 40 and both of the vacuum transfer chambers 20a and 20b may be vertically overlapped with each other. FIG. 4B is a cross-sectional view showing another example of the schematic configuration of the connecting unit 40 according to the embodiment. In FIG. 4B, parts of the vacuum transfer chambers 20a and 20b extend to the position below the connecting unit 40, and parts of the connecting unit 40 and the vacuum transfer chambers 20a and 20b are vertically overlapped with each other. In FIG. 4B, parts of the range of motions of the transfer robots 25a and 25b when transferring the wafers W to the vacuum processing chambers go below the connecting unit 40.

Next, the operation of the substrate processing system 10 will be described. In the substrate processing system 10, a carrier accommodating wafers W is placed on the load port LP of the loader module 30. The transfer unit (not shown) of the loader module 30 extracts a wafer W from the carrier. The gate valve G2 of one of the load-lock modules LLM is opened. The transfer unit transfers the extracted wafer W into the opened load-lock module LLM through the gate valve G2. After the wafer W is loaded, the gate valve G2 of the load-lock module LLM is closed. Then, the load-lock module LLM is vacuum-exhausted.

When a pressure in the load-lock module LLM reaches a predetermined vacuum level, the gate valve G2 of the load-lock module LLM is opened. In the vacuum transfer chamber 20a, the transfer robot 25a is lowered to the first height, and the transfer robot 25a extracts the wafer W from the load-lock module LLM.

For example, in the case of processing the wafer W in any one of the processing modules PM1 to PM4, the transfer robot 25a transfers and loads the wafer W to the vacuum processing chamber of any one of the processing modules PM1 to PM4 through the transfer port 23 at the first height. The transfer robot 25a returns the empty arm 26 to the vacuum transfer chamber 20a. The gate valve G1 of one of the processing modules PM1 to PM4 into which the wafer W is loaded is closed, and the loaded wafer W is processed.

Alternatively, in the case of transferring the wafer W from the vacuum transfer chamber 20a to the vacuum transfer chamber 20b and processing the wafer W in any one of the processing modules PM5 to PM8, the transfer robot 25a is raised to the second height and transfers the wafer W to the holder 41. Then, the transfer robot 25b is raised to the second height and extracts the wafer W from the holder 41. Next, the transfer robot 25b is lowered to the first height and transfers and loads the wafer W to the vacuum processing chamber of one of the processing modules PM5 to PM8 through the transfer port 23.

FIGS. 5A to 5F show an example of a flow of transferring the wafer W according to the embodiment. FIGS. 5A to 5F show a flow of transferring the wafer W from the vacuum transfer chamber 20a to the vacuum transfer chamber 20b and then to the vacuum processing chamber of the processing module PM8. FIGS. 5A to 5F show a case in which a part of the connecting unit 40 and the vacuum transfer chamber 20b are vertically overlapped with each other as shown in FIG. 4A. In FIG. 5A, the wafer W transferred by the transfer robot 25a is held on the holder 41. The transfer robot 25b is raised to the second height and extracts the wafer W from the holder 41 (see FIGS. 5A to 5C). Then, the transfer robot 25b is lowered to the first height, transfers the wafer W and loads into the vacuum processing chamber of the processing module PM8 through the transfer port 23 (see FIGS. 5D to 5F).

The transfer robot 25b returns the empty arm 26 to the vacuum transfer chamber 20b. The gate valve G1 of one of the processing modules PM5 to PM8 into which the wafer W is loaded is closed, e.g., the processing module PM8, and the loaded wafer W is processed.

In the case when the pressures in the vacuum transfer chambers 20a and 20b are different from each other, the substrate processing system 10 opens the gate valve G4a and the transfer robot 25a transfers the wafer W to the holder 41. Next, the substrate processing system 10 closes the gate valve G4a, adjusts the pressure in the connecting unit 40 to the pressure of the vacuum transfer chamber 20b, and then opens the gate valve G4b.

In the case of performing another vacuum processing with a next processing module PM on the wafer W that has been subjected to vacuum processing, the wafer W is transferred to the next processing module PM through the vacuum transfer chamber 20. For example, when the wafer W is transferred between the vacuum transfer chambers 20a and 20b, the transfer robots 25a and 25b are raised to the second height and transfer the wafer W through the holder 41.

The wafer W that has been subjected to all of the vacuum processing is transferred to the carrier in reverse order of the loading operation.

As described above, the substrate processing system 10 of the present embodiment is capable of transferring the wafer W between the vacuum transfer chambers 20a and 20b that are connected to each other.

Figure 6:
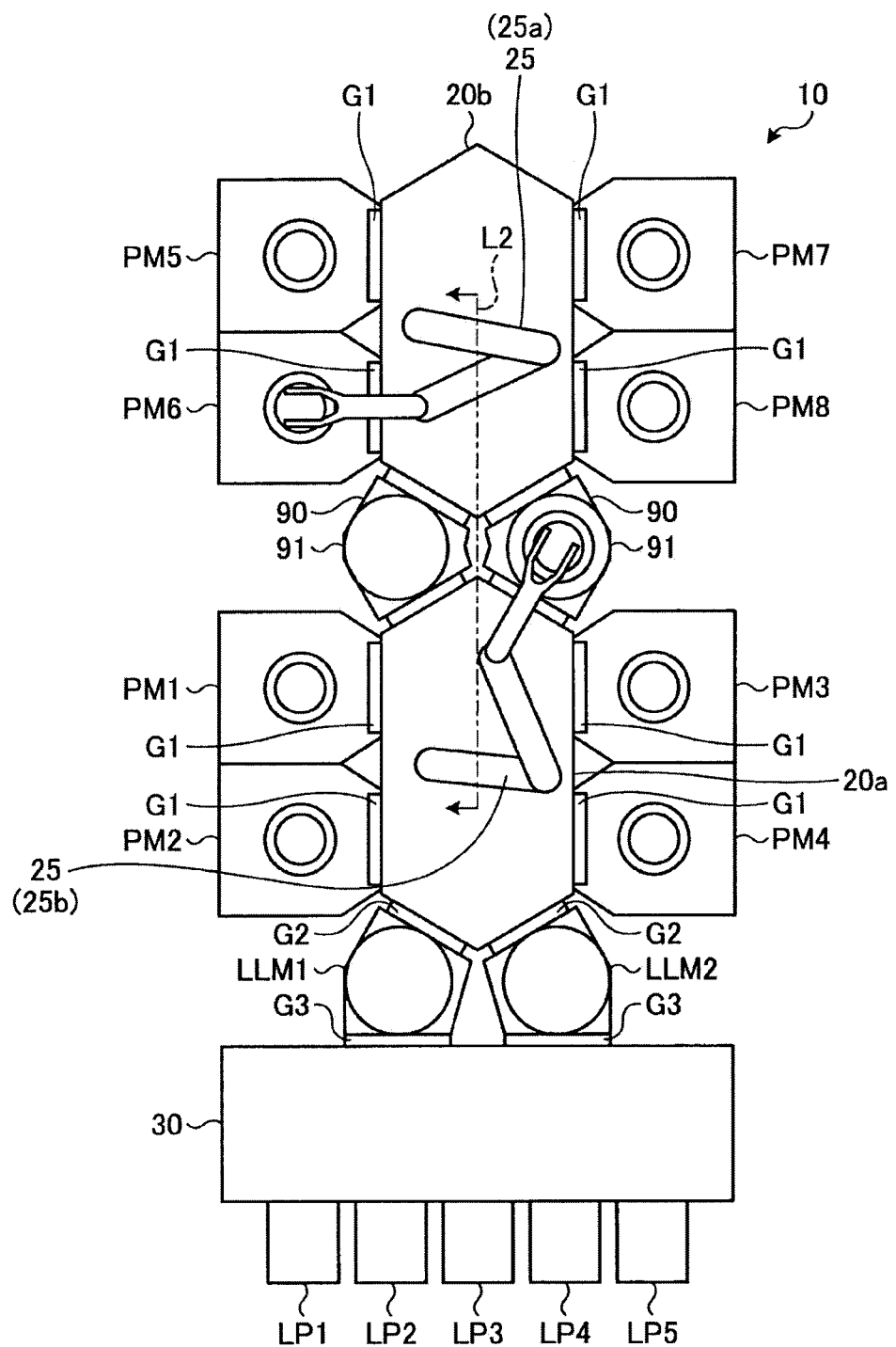
FIG. 6 shows an example of an overall schematic configuration of a substrate processing apparatus according to a comparative example.
Figure 7:
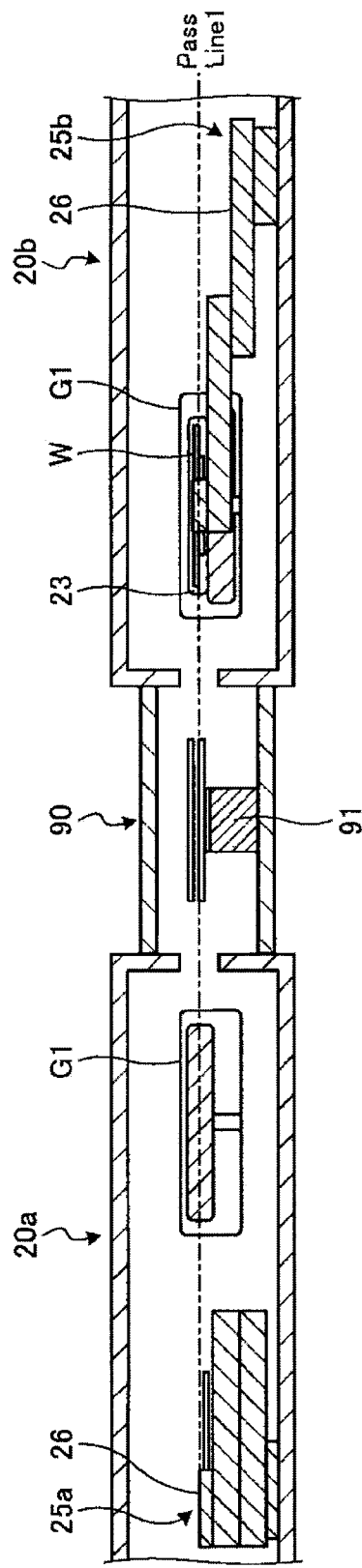
FIG. 7 is a cross-sectional view showing an example of a schematic configuration of an intermediate transfer chamber according to the comparative example.

FIG. 6 shows an example of an overall schematic configuration of a substrate processing apparatus according to a comparative example. In FIG. 6, like reference numerals are given to like parts corresponding to those of the substrate processing system 10 according to the embodiment shown in FIG. 1. The vacuum transfer chambers 20a and 20b of the substrate processing system 10 shown in FIG. 6 have a substantially hexagonal planar shape and are connected to each other through two intermediate transfer chambers 90. FIG. 7 is a cross-sectional view showing an example of a schematic configuration of an intermediate transfer chamber according to the comparative example. FIG. 7 shows a cross section taken along a dashed line L2 in FIG. 6. The intermediate transfer chamber 90 includes a holder for holding the wafer W. The intermediate transfer chamber 90 has the holder 91 disposed at a height at which the transfer robots 25a and 25b transfer the wafers W to the processing modules PM through the transfer ports 23. In other words, the intermediate transfer chamber 90 has the holder 91 disposed at a first height at which the transfer port 23 is located. In FIG. 7, "Pass Line1" indicates the first height. In this case, in the substrate processing system 10, the holder 91 should be disposed while avoiding interference with the movement of the arms 26 of the transfer robots 25a and 25b when transferring the wafers W to the vacuum processing chambers through the transfer ports 23. Therefore, in the substrate processing system 10 shown in FIGS. 6 and 7, the holder 91 is disposed to be separated from the transfer port 23 not to be overlapped with the range of motions of the arms 26 of the transfer robots 25a and 25b when transferring the wafers W to the vacuum processing chambers. Accordingly, the substrate processing system 10 shown in FIGS. 6 and 7 requires a large size of the installation area.

On the other hand, in the substrate processing system 10 of the present embodiment, as shown in FIGS. 1 to 5F, the connecting unit 40 is disposed such that a part of the connecting unit 40 vertically overlaps the range of motion of the transfer robot 25a when transferring the wafer W to the vacuum processing chamber at a height different from a height at which the transfer port 23 is disposed when viewed from the top. Accordingly, in the substrate processing system 10 of the present embodiment, the holder 41 can be disposed near the transfer port 23 while avoiding interference with the movement of the arms 26 of the transfer robots 25a and 25b during the transfer of the wafers W to the vacuum processing chambers, which makes it possible to suppress an increase in the size of the installation area.

As described above, the substrate processing system 10 of the present embodiment includes the processing modules (first substrate processing chambers) PM1 to PM4, the vacuum transfer chamber (first substrate transfer chamber) 20a, and the processing modules (second substrate processing chambers) PM5 to PM8, the vacuum transfer chamber (second substrate transfer chamber) 20b, and the connecting unit (buffer chamber) 40. The vacuum transfer chamber 20a is connected to the processing modules PM1 to PM4. The vacuum transfer chamber 20b is connected to the processing modules PM5 to PM8. The connecting unit 40 is connected between the vacuum transfer chambers 20a and 20b and has at least one holder (substrate holder) 41. At least a part of the connecting unit 40 and at least one of the vacuum transfer chambers 20a or 20b are vertically overlapped with each other. Accordingly, the substrate processing system 10 can suppress the increase in the size of the installation area.

The vacuum transfer chamber 20a has the transfer robot (first substrate transfer robot) 25a configured to transfer the wafer (substrate) W. The transfer robot 25a is movable between a first height and a second height different from the first height. The transfer robot 25a is configured to transfer the wafer W between the vacuum transfer chamber 20a and the processing modules PM1 to PM4 at the first height and to transfer the wafer W between the vacuum transfer chamber 20a and the connecting unit 40 at the second height. Accordingly, the transfer robot 25a transfers the wafer W to the processing modules PM1 to PM4 at the first height and transfers the wafer W to the vacuum transfer chamber 20b through the holder 41 at the second height.

Further, the vacuum transfer chamber 20b has the transfer robot (second substrate transfer robot) 25b configured to transfer the wafer W. The transfer robot 25b is movable between the first height and the second height. The transfer robot 25b is configured to transfer the substrate (e.g., the wafer W) between the vacuum transfer chamber 20b and the processing modules PM5 to PM8 at the first height and to transfer the substrate between the vacuum transfer chamber 20b and the connecting unit 40 at the second height. Accordingly, through the vacuum transfer chamber 20b, the wafer W can be transferred to the processing modules PM5 to PM8 at the first height and to the vacuum transfer chamber 20a through the holder 41 at the second height.

The vacuum transfer chamber 20a has the first transfer ports (transfer ports 23) configured to communicate with the processing modules PM1 to PM4. The vacuum transfer chamber 20b has the second transfer ports (the transfer ports 23) configured to communicate with the processing modules PM5 to PM8. At least a part of the connecting unit 40 is disposed above or below at least one of the first transfer port or the second transfer port when viewed from the side. Therefore, the holder 41 can be disposed while avoiding the interference with the moving spaces of the transfer robots 25a and 25b when transferring the wafers W to the processing modules PM. Accordingly, it is possible to suppress an increase in the size of the installation area.

At least a part of the connecting unit 40 is disposed above at least one of the first transfer port or the second transfer port when viewed from the side, and the second height is higher than the first height. Therefore, the holder 41 can be disposed while avoiding the interference with the moving spaces of the transfer robots 25a and 25b when transferring the wafers W to the processing modules PM. Accordingly, it is possible to suppress an increase in the size of the installation area.

Further, the connecting unit 40 includes the gate valves G4a and G4b that are disposed between the connecting unit 40 and the vacuum transfer chambers 20a and 20b. Accordingly, even when the pressures in the vacuum transfer chambers 20a and 20b are different from each other, the substrate processing system 10 can transfer the wafer W while adjusting the pressure in the connecting unit 40.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, the above embodiments have described the wafer W as an example of the substrate. However, the substrate is not limited thereto and may be another substrate such as a glass substrate or the like.

Further, the above embodiments have described the case where the second height is higher than the first height. However, the second height may be lower than the first height. In other words, the vacuum transfer chambers 20a and 20b may be connected through the connecting unit 40 at a position lower than the first height.

Further, the above embodiments have described the case where the two vacuum transfer chambers 20 of the substrate processing system 10 are connected by the connecting unit 40. However, in the substrate processing system 10, three or more vacuum transfer chambers 20 may be connected by the connecting unit 40.

Figure 8:
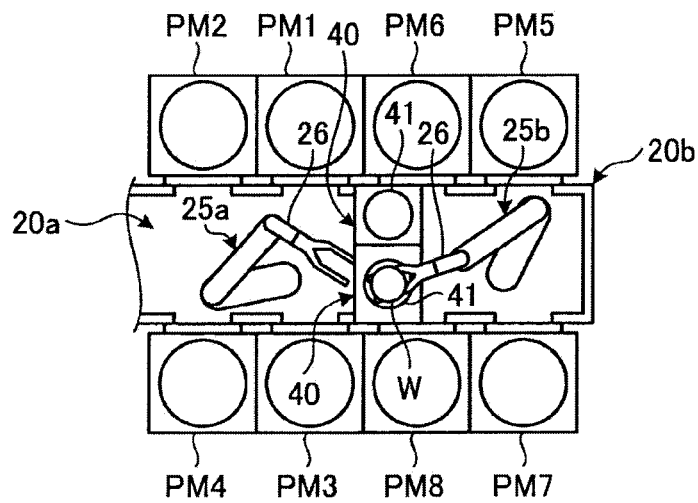
FIG. 8 shows another example of the overall schematic configuration of the substrate processing apparatus according to the embodiment.

Further, the above embodiments have described the case where the connecting unit 40 has one holder 41. However, the connecting unit 40 may have a plurality of holders 41. FIG. 8 shows another example of the overall schematic configuration of the substrate processing apparatus according to the embodiment. In the substrate processing system 10 shown in FIG. 8, the connecting unit 40 has two holders 41.

Figure 9:
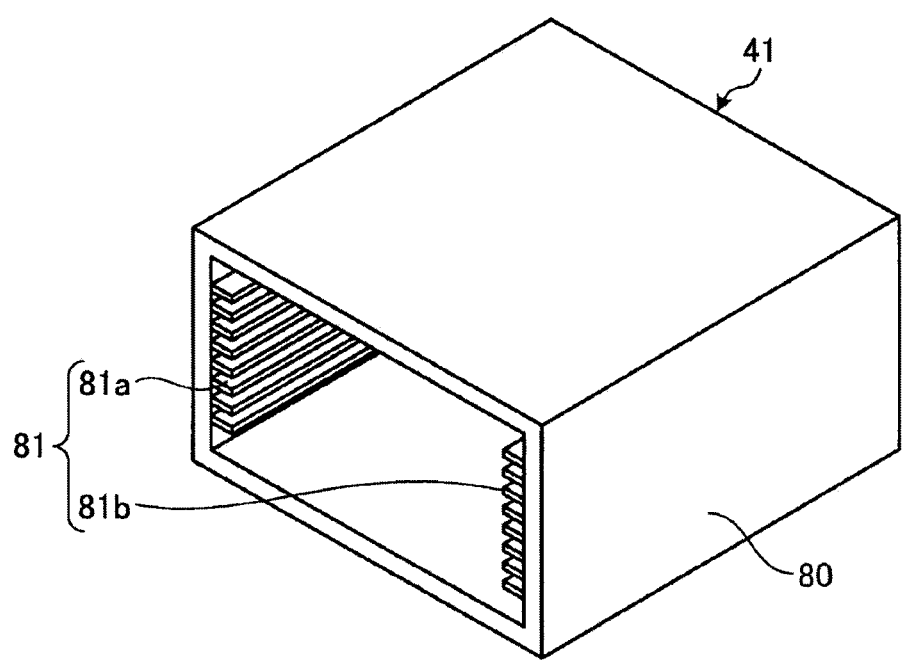
FIG. 9 shows an example of a schematic configuration of a holder (substrate holder) capable of holding a plurality of wafers according to the embodiment.
Figure 10:
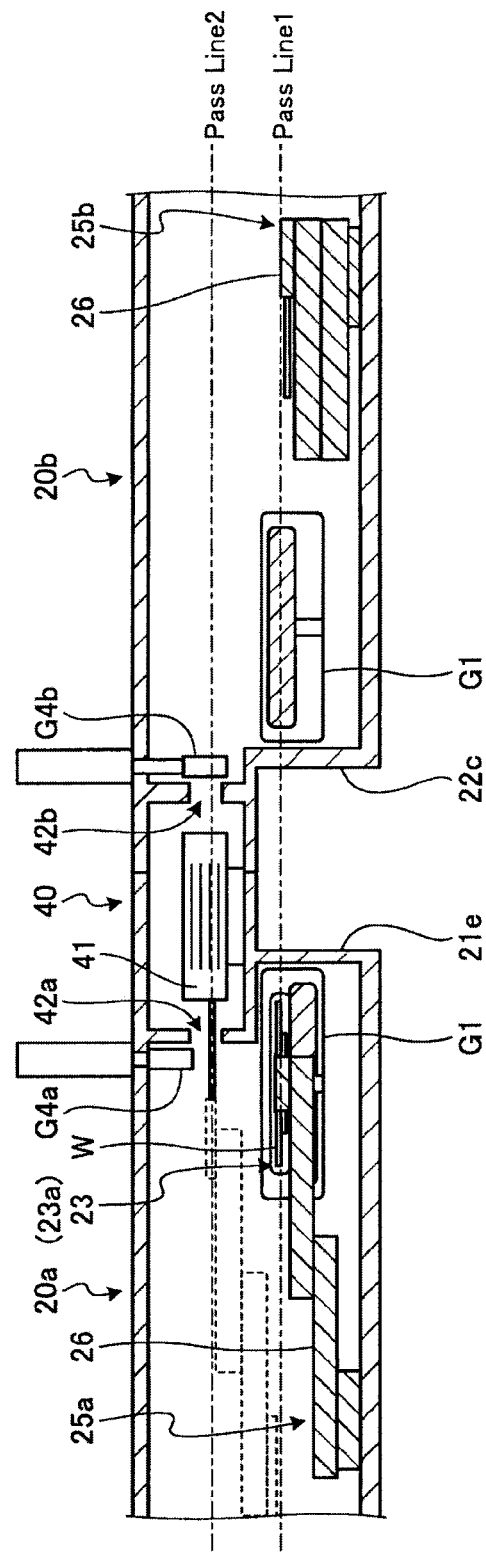
FIG. 10 is a cross-sectional view showing still another example of the schematic configuration of the connecting unit according to the embodiment.

Further, the holder 41 may hold a plurality of vertically stacked wafers W. FIG. 9 shows an example of a schematic configuration of the holder 41 capable of holding the plurality of wafers W according to the embodiment. The holder 41 has a frame 80 and a plurality of supports 81. The frame 80 is formed in a substantially rectangular parallelepiped shape and has openings on two opposing vertical surfaces. The supports 81 are disposed at an inner side surface of the frame 80. The supports 81 are vertically spaced from each other. Each of the supports 81 has plates 81a and 81b respectively protruding from the inner side surfaces of the frame 80 opposite to each other. The plates 81a and 81b of each support 81 are disposed at the same height and support the edge portion of the wafer W. The holder 41 can hold a plurality of vertically stacked wafers W by supporting the edge portions of the wafers W with the plates 81a and 81b of the supports 81. FIG. 10 is a cross-sectional view showing another example of the schematic configuration of the connecting unit 40 according to the embodiment. FIG. 10 shows a case where the connecting unit 40 has the holder 41 capable of holding multiple wafers W. The holder 41 is disposed with the openings on the side surfaces facing the vacuum transfer chambers 20a and 20b. The transfer robots 25a and 25b of the vacuum transfer chambers 20a and 20b transfer the wafers W into the holder 41 through the openings so that the wafers W can be supported by the supports 81 and unload the wafers W supported by the supports 81.

Further, the above embodiments have described the case where the substrate processing system 10 performs the substrate processing on the substrate in a vacuum (depressurized) state. However, the substrate processing system 10 may perform the substrate processing on the substrate in an atmospheric (normal pressure) state. For example, in the substrate processing system 10, the vacuum transfer chamber 20 may serve as an atmospheric transfer chamber for transferring the substrate in an atmospheric (normal pressure) state. Alternatively, in the substrate processing system 10, the vacuum processing chamber of the processing module PM may serve as an atmospheric processing chamber for performing substrate processing in an atmospheric (normal pressure) state.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing system comprising:
a first substrate processing chamber;
a first substrate transfer chamber connected to the first substrate processing chamber;
a second substrate processing chamber;
a second substrate transfer chamber connected to the second substrate processing chamber; and
a buffer chamber connected between the first substrate transfer chamber and the second substrate transfer chamber, the buffer chamber having at least one substrate holder,
wherein at least a part of the buffer chamber and at least one of the first substrate transfer chamber or the second substrate transfer chamber are overlapped with each other when viewed from a top of the substrate processing system,
wherein the first substrate transfer chamber has a first transfer port communicable with the first substrate processing chamber and a stepped side portion, a lower portion of the stepped side portion protruding more toward the buffer chamber than an upper side of the stepped side portion to form a rectangular protruding part, wherein the rectangular protruding part is entirely overlapped with at least the part of the buffer chamber when viewed from the top,
wherein at least a part of the first transfer port and the rectangular protruding part are overlapped with each other when viewed from a side of the substrate processing system,
wherein the first transfer port is not overlapped with the buffer chamber, when viewed from the side of the substrate processing system, and
wherein an upper surface of the buffer chamber, an upper surface of the first substrate transfer chamber, and an upper surface of the second substrate transfer chamber form the same plane.

2. The substrate processing system of claim 1, wherein the first substrate transfer chamber has a first substrate transfer robot configured to transfer a substrate,
the first substrate transfer robot is movable between a first height and a second height different from the first height, and
the first substrate transfer robot is configured to transfer a substrate between the first substrate transfer chamber and the first substrate processing chamber at the first height and to transfer a substrate between the first substrate transfer chamber and the buffer chamber at the second height.

3. The substrate processing system of claim 2, wherein the second substrate transfer chamber has a second substrate transfer robot configured to transfer a substrate,
the second substrate transfer robot is movable between the first height and the second height, and
the second substrate transfer robot is configured to transfer a substrate between the second substrate transfer chamber and the second substrate processing chamber at the first height and to transfer a substrate between the second substrate transfer chamber and the buffer chamber at the second height.

4. The substrate processing system of claim 3, wherein the second substrate transfer chamber has a second transfer port communicable with the second substrate processing chamber, and
at least the part of the buffer chamber is disposed above at least one of the first transfer port or the second transfer port when viewed from the side.

5. The substrate processing system of claim 4, wherein the second height is higher than the first height.

6. The substrate processing system of claim 2, wherein the second substrate transfer chamber has a second transfer port communicable with the second substrate processing chamber, and
at least the part of the buffer chamber is disposed above at least one of the first transfer port or the second transfer port when viewed from the side.

7. The substrate processing system of claim 6, wherein the second height is higher than the first height.

8. A substrate transfer apparatus comprising:
a substrate transfer chamber connected to a substrate processing chamber; and
a buffer chamber connected to the substrate transfer chamber, the buffer chamber also connectable to a different substrate transfer chamber,
the buffer chamber having at least one substrate holder, wherein at least a part of the buffer chamber and the substrate transfer chamber are vertically overlapped with each other when viewed from a top of the substrate transfer apparatus, wherein the substrate transfer chamber has a transfer port communicable with the substrate processing chamber and a stepped side portion, a lower portion of the stepped side portion protruding more toward the buffer chamber than an upper side of the stepped side portion to form a rectangular protruding part, wherein the rectangular protruding part is entirely overlapped with at least the part of the buffer chamber when viewed from the top, wherein at least a part of the transfer port and the rectangular protruding part are overlapped with each other when viewed from a side of the substrate processing system, wherein the transfer port is not overlapped with the buffer chamber, when viewed from the side of the substrate transfer apparatus, and wherein an upper surface of the buffer chamber, an upper surface of the substrate transfer chamber, and an upper surface of the different substrate transfer chamber form the same plane.

\* \* \* \* \*